United States Patent [19]

Johnston et al.

[11] 4,358,732
[45] Nov. 9, 1982

[54] SYNCHRONIZED VOLTAGE CONTRAST DISPLAY ANALYSIS SYSTEM

[75] Inventors: Merrill F. Johnston, Marina Del Rey; Alex Shumka, La Canada; Emmett Miller, Long Beach; Kenneth C. Evans, Pasadena, all of Calif.

[73] Assignee: California Institute of Technology, Pasadena, Calif.

[21] Appl. No.: 180,230

[22] Filed: Aug. 22, 1980

Related U.S. Application Data

[63] Continuation of Ser. No. 38,550, May 14, 1979.

[51] Int. Cl.$^3$ ............................................. G01R 15/12
[52] U.S. Cl. ................................. 324/73 R; 250/311; 356/394
[58] Field of Search ................. 250/492.1, 307, 310, 250/311, 338; 356/394; 324/73 R, 158 D

[56] References Cited

U.S. PATENT DOCUMENTS 3,868,508  2/1975  Lloyd .................................. 250/338
4,041,311  8/1977  Martin ................................ 250/310

OTHER PUBLICATIONS

Balk, L. J. et al., "Quantitative Voltage Contrast at High Frequencies in the SEM", Scanning Electron Microscopy, 1976 (Part IV) pp. 615-624.

*Primary Examiner*—David K. Moore
*Attorney, Agent, or Firm*—Freilich, Hornbaker, Wasserman, Rosen & Fernandez

[57] ABSTRACT

An apparatus and method for comparing internal voltage potentials of first and second operating electronic components such as large scale integrated circuits (LSI's) in which voltage differentials are visually identified via an appropriate display means. More particularly, in a first embodiment of the invention a first and second scanning electron microscope (SEM) are configured to scan a first and second operating electronic component respectively. The scan pattern of the second SEM is synchronized to that of the first SEM so that both simultaneously scan corresponding portions of the two operating electronic components. Video signals from each SEM corresponding to secondary electron signals generated as a result of a primary electron beam intersecting each operating electronic component in accordance with a predetermined scan pattern are provided to a video mixer and color encoder. Each video signal is encoded in accordance with a different primary color, a composite signal thereof being provided to a color TV monitor. If corresponding portions of the two video signals have the same voltage potential, one color will appear on the TV monitor. If they are different, then other colors will appear, the exact color being related to the voltage differential and which of the two operating electronic component portions has the higher voltage. Thus, an operator can immediately identify whether the two operating components are performing in a similar manner, and if not, can determine by noting the color shift at what points within the operating electronic components non-identical operation is occurring. If one component is a master component and is known to be operating correctly, then a failure point within a test component can be isolated and the cause of failure investigated.

22 Claims, 4 Drawing Figures

4,358,732

SYNCHRONIZED VOLTAGE CONTRAST DISPLAY ANALYSIS SYSTEM

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

This is a continuation of application Ser. No. 038,550, filed May 14, 1979.

FIELD OF THE INVENTION

The field of art to which the invention pertains relates to testing of electronic components, and more particularly to comparison testing using a scanning electron microscope means in which voltage potentials at corresponding locations on two substantially identical operating electronic components are compared and their differences visually displayed.

BACKGROUND OF THE INVENTION

Complex electronic components, particularly large scale integrated circuits (LSI's) such as microprocessors, have many internal interconnections where voltages cannot be directly measured except by microprobes. These microprobes are unsatisfactory because they sometimes damage the component or introduce unwanted electrical loading. Voltage contrast images have been obtained utilizing a scanning electron microscope (SEM) whose output video signals contain information relating to voltages at these interconnections. However, these images quickly become difficult or impossible to interpret as component complexity increases. There has long been a need for a non-destructive method and apparatus to compare internal voltages of an operating electronic component such as the type above-described and a reference electronic component in which differences between internal voltages at corresponding points on the two components can be rapidly identified in order that appropriate isolation or corrective measures may be taken. The present invention provides such a method and apparatus.

SUMMARY OF THE INVENTION

The invention provides an apparatus and method for comparing internal voltage potentials at corresponding points of first and second operating electronic components such as LSI's. The apparatus comprises a scanning electron microscope means wherein the first and second operating electronic components are scanned by a primary electron beam in accordance with predetermined scanning patterns. The intersection of the primary electron beam and the operating electronic component creates a secondary electron signal which is related to the voltage potential at the intersection. The invention provides a means for displaying signals related to the secondary electron signals created from each operating electronic component so that voltage differentials between predetermined portions thereof can be visually identified, thereby providing a means to isolate portions within the two operating electronic circuits which are not functioning in an identical manner. In a first embodiment of the invention, the display means is a color TV monitor and the scanning electron microscope means comprises two electron microscopes whose scanning patterns are predetermined and synchronized with respect to each other. The first scanning electron microscope provides a first output video signal which is color encoded to one of the primary colors. The second scanning electron microscope, whose scan is synchronized to that of the first scanning electron microscope, provides a second output video signal which is color encoded to another primary color. These two color encoded signals are mixed and provided to a color TV monitor which then provides a color display. If the two output video signals have the same voltage, then the color on the TV monitor will consist of a mixture of both colors. For example, if the two primary colors are red and green, then equal output video signals will appear as yellow. If they have different voltages, then the colors displayed will tend to be either green or red, depending upon which of the two output video signals has the higher voltage potential. Thus, an operator can quickly view the single TV monitor and determine that the components are performing identically if all the images are yellow. If color differences appear, the operator can immediately identify where the discrepancy is occurring within the electronic component.

In accordance with a second embodiment of the invention, a black and white TV monitor is used. In this embodiment, which is especially useful for comparing digital circuits, the output video signal corresponding to voltage potentials within the first electronic component is provided as one input to a comparator. If this output video signal is above a predetermined level, the output of the comparator will correspond to a digital one state, and if the voltage is below the predetermined level the output of the comparator will correspond to a digital zero. The same comparison is made for the output video signal corresponding to voltage potentials within the second electronic component. These two compared signals are then supplied to an Exclusive-Or gate which then provides an output corresponding to a logical zero when the two inputs both correspond to ones or zeros, and provides a one output when the two inputs correspond to a one and a zero. The output of the Exclusive-Or gate then controls an electronic switch so that if the output is a one, then a first visually identifiable signal appears on the display, and if the output is zero a second visually identifiable signal appears on the display. Thus, an operator looking at the display can immediately determine if the same points within the operating electronic components correspond to the same or different logic levels, this distinction being made utilizing a black and white TV monitor.

In accordance with the third embodiment of the invention, a single SEM is utilized for scanning both the first and second operating electronic components. A first video signal corresponding to the first operating electronic component is color encoded with one of the primary colors and a second video signal corresponding to the second operating component is color encoded with a second primary color. Images corresponding to the first and second operating electronic components are sequentially displayed on the TV monitor, the scan rate of which is chosen to be sufficiently fast so that the display presented will appear similar to that provided in the first embodiment.

DETAILED DESCRIPTION

As required, detailed illustrative embodiments of the invention are disclosed herein. These embodiments exemplify the invention and are currently considered to be the best embodiments for such purposes. However, it is to be recognized that other means for comparing and displaying voltage differentials between predetermined portions of two operating electronic components could be utilized. Accordingly, the specific embodiments disclosed are representative in providing a basis for the claims which define a scope of the present invention.

As previously explained, the invention provides a means for comparing internal voltage potentials of first and second operating electronic components by simultaneously scanning each component with separate scanning electron microscopes (SEM's), one SEM being designated as a master and the other SEM as a slave. The slave SEM scans in accordance with a predetermined scan pattern generated for the master SEM. In one embodiment, a video signal related to the secondary electron signal generated by each SEM is color encoded and used to drive a color TV monitor. Synchronization of the two video signals is effected so that portions of the two video signals corresponding to predetermined portions of their respective scan patterns overlap on the TV monitor, thus providing a means whereby voltages within a predetermined differential appear as one color and voltages not within the predetermined differential appear as other colors. The specific color indicates which of the two operating electronic components has the higher voltage. In a second embodiment of the invention, a means is provided wherein video information only appears on a display monitor when the voltage differential between corresponding portions of the predetermined scan patterns exceeds a certain level. A third embodiment of the invention provides a means wherein a single SEM can be utilized.

Figure 1:
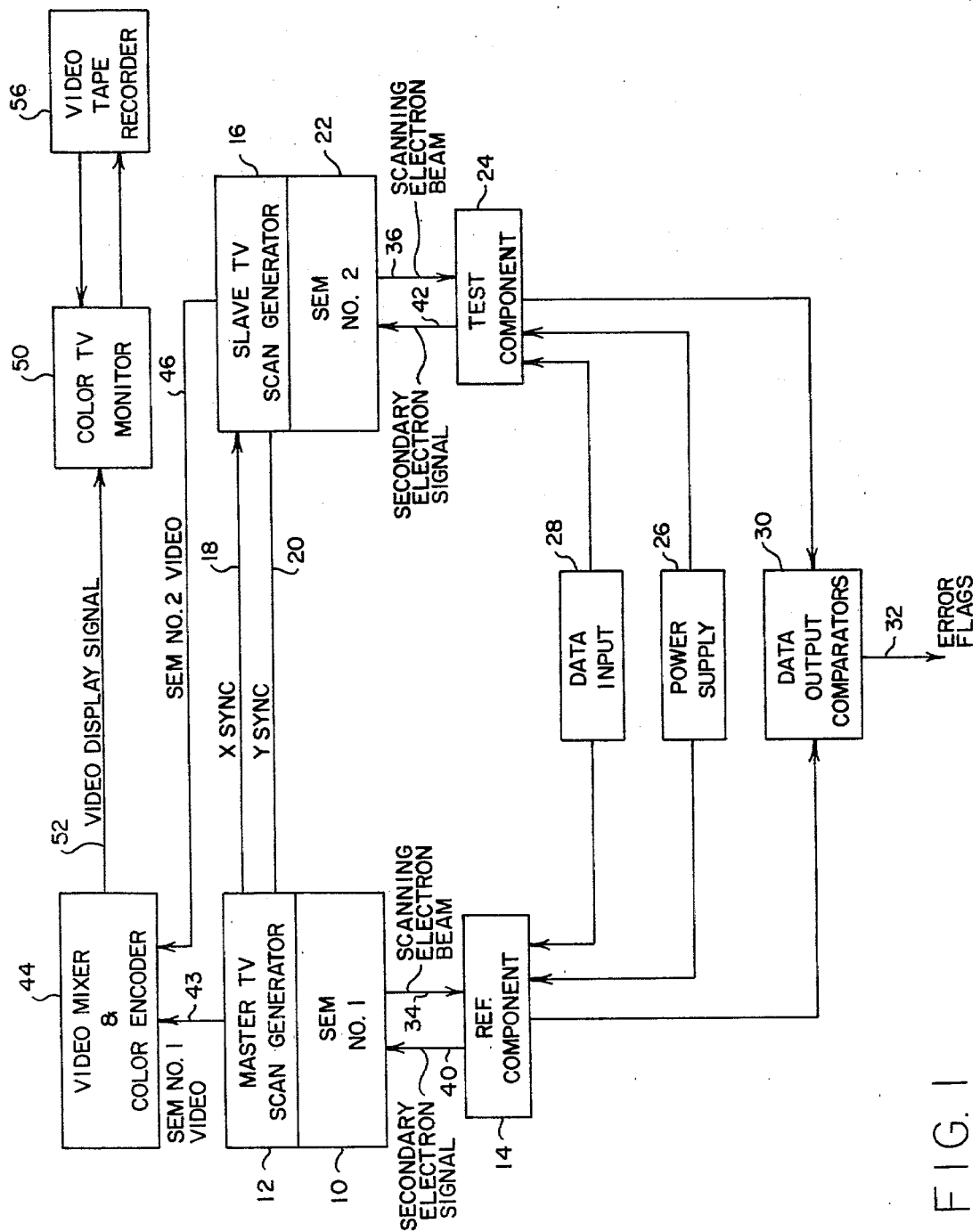
FIG. 1 is a block diagram of a synchronized voltage contrast display analysis system according to a first embodiment of the invention.

Referring to FIG. 1, a first scanning electron microscope (SEM) 10 and an associated master television scan generator 12 are provided. A reference component 14 is shown, the reference component 14 being scanned by a predetermined scan pattern generated by the master television scan generator 12. Synchronization signals are provided to a slave television scan generator 16 via an X synchronization line 18 and a Y synchronization line 20. The slave television scan generator 16 controls a second scanning electron microscope 22 which in turn scans a test component 24, the scan pattern being the same predetermined scan pattern utilized in conjunction with the reference component 14. A power supply 26 is provided for powering both the reference component 14 and the test component 24. A data input means 28 is also provided in order to operate the reference and test components 14 and 24 in a predetermined manner. Data outputs from the reference component 14 and the test component 24 are supplied to a data output comparator 30 which provides an indication whenever one of the components is not operating the same as the other, this indication being provided by an error flag signal shown at 32. It is important that both the reference component 14 and test component 24 are in an operating configuration so that voltage potentials within the components can be compared, it being possible that for the specific data input being supplied, there would not be an error in the output data although voltage differentials within the component exist and errors may occur for other data inputs. For other reasons, it is important that the reference and test components 14 and 24 be operating. If the two components are integrated circuits, such as large scale integrated circuits (LSI's), voltage differentials between the operating components provide information as to where defects or damage exist on the failing component.

Each of the SEM's 10 and 22 provide a scanning or primary electron beam 34 and 36, respectively, these beams causing secondary electrons to be emitted from each component under test. The number and intensity of secondary electrons emitted from the components being scanned are related to the voltage potential at the point being irradiated by the scanning electron beam such that areas of lower potential emit more secondary electrons and produce a more intense video signal then areas of higher potential. The secondary electron signals derived from the emitted secondary electrons are provided on secondary electron lines 40 and 42 for SEM's 1 and 2, respectively. The secondary electron signals are provided by conventional scanning electron microscopes and it is not necessary to explain their characteristics in more detail other than to say than they are related to the voltage potential at a point being irradiated by the scanning electron beam. An SEM No. 1 video signal 43 related to the secondary electron signal 40 generated by SEM No. 1 is provided to a conventional video mixer and color encoder 44. Likewise, an SEM No. 2 video signal 46 related to the secondary electron signal 42 from SEM No. 2 is also provided to the video mixer and color encoder 44, the output of which is a color encoded video display signal. A color TV monitor 50, which could be a conventional display monitor or a color kinescope having a first color gun and a second color gun, is provided for displaying the video display signal 52. The video mixer and color encoder 44 is configured so that video from SEM No. 1 is encoded to correspond to a first color and video from SEM No. 2 is encoded to correspond to a second color. A combination of the first and second colors on the color TV monitor 50 provides a third visually distinguishable color, the precise color being related to voltage differentials between the reference component 14 and the test component 24. For example, if the operating voltage at a segment being scanned in the reference component 14 is less than the operating voltage at a corresponding segment in the test component 24, then the video signal 43 from SEM No. 1 will be greater than the video signal 46 from SEM No. 2. Thus, the color associated with the SEM No. 1 video signal 43 will appear stronger on the color TV monitor 50 than the color associated with the SEM No. 2 video signal 46. Similarly, if the voltage in the reference component 14 is higher than the corresponding voltage in the test component 24, then the color TV monitor 50 will display a color biased towards that associated with the SEM No. 2 video signal 46. Although any two colors could be used for color encoding the two video signals 43 and 46, it has been found that the two primary colors red and green provide a satisfactory display. Assuming, for example, that the SEM No. 1 video signal 43 is color encoded red and that the SEM No. 2 video signal is color encoded green, regions of the two operating components 14 and 24 having the same voltage potential will appear on the color TV monitor 50 as a sum color yellow. Regions of the two components 14 and 24 having different voltage potentials will result in their associated video signals 43 and 46 having different intensities and thus will appear shifted in color toward one or the other primary color. An operator by looking at the TV monitor 50 can immediately identify through color identification those portions of the reference component 14 and test component 24 which are operating differently. A video tape recorder 56 is also provided as a means for TV playback when desired.

Figure 2:
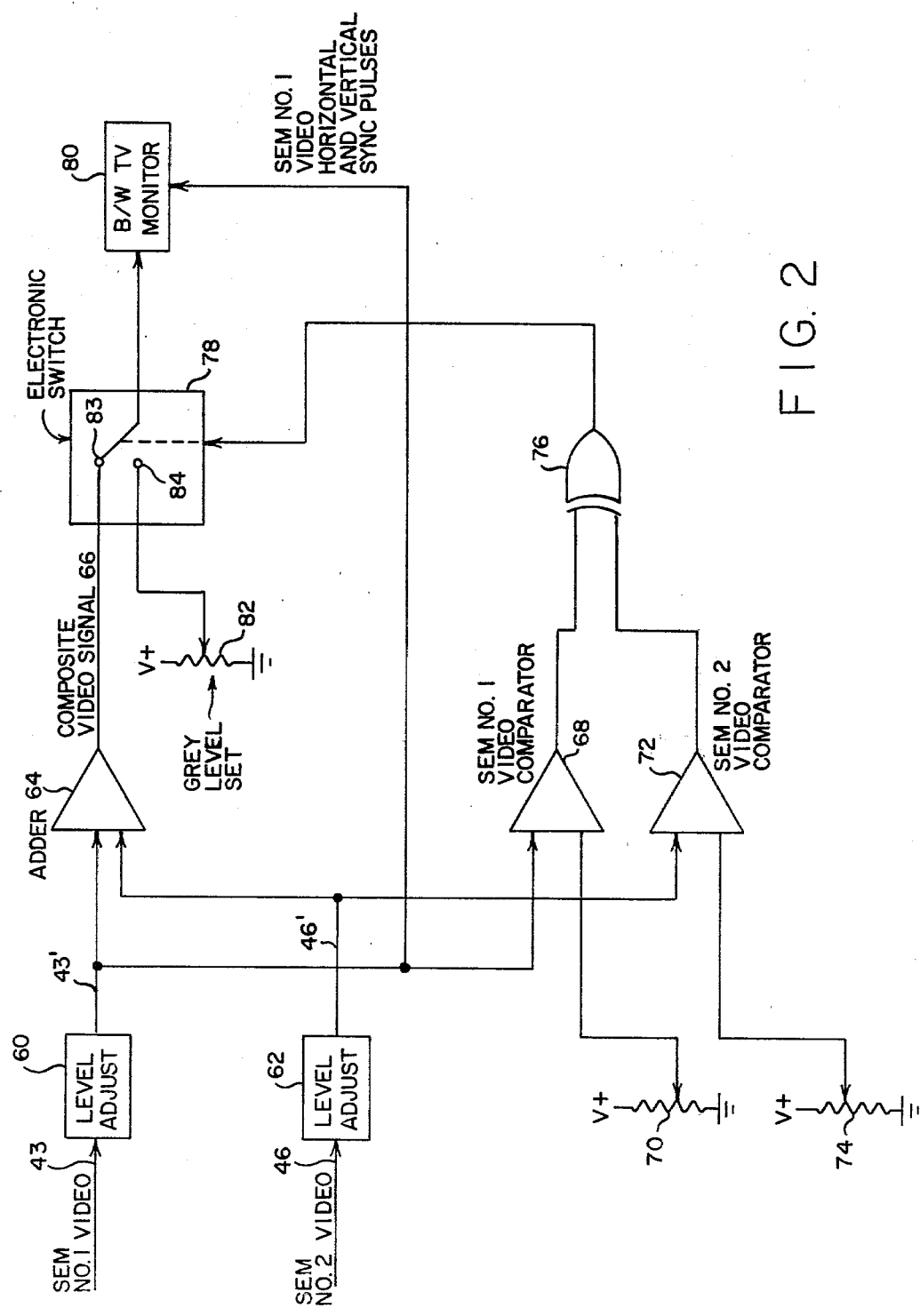
FIG. 2 is a block diagram according to a second embodiment of the invention in which voltage comparisons are made utilizing a black and white television monitor.

A second embodiment of the invention using a black and white television monitor is shown in FIG. 2. Video signals from the first SEM 10 and the second SEM 22 are provided to first and second level adjustment circuits 60 and 62, respectively the outputs of which are provided to a video signal adder 64. The video signal adder 64 outputs a composite video signal 66, the purpose of which will be explained below. The output of the first level adjust circuit 60 is also provided to an SEM No. 1 video signal comparator 68, the other input being provided by a comparison voltage derived from a first potentiometer 70. In a similar manner, the output of the second level adjust circuit 62 is provided to an SEM No. 2 video signal comparator 72, the other input being derived from a second potentiometer 74. Outputs from the two video signal comparators 68 and 72 are provided to an Exclusive-Or gate 76, the output of which is used to control an electronic switch 78. The output of the electronic switch 78 drives a black and white television monitor 80 which is synchronized by vertical and horizontal sync pulses derived from the SEM No. 1 video signal 43′ provided directly to the TV monitor 80. A gray level setting potentiometer 82 is provided as another input to the electronic switch 78, the first input being the composite video signal 66. It should be recognized, however, that a color television monitor could also be utilized in lieu of the black and white monitor shown.

A system configured according to the second embodiment operates as follows. Video signal intensities from SEM's No. 1 and 2 are adjusted by the first and second level adjust circuits 60 and 62, respectively. These adjustments are made so that the video signal intensities will be approximately equal at the inputs to the video adder 64. The first potentiometer 70 is adjusted so that when the video from the first level adjust circuit 60 is above a predetermined voltage, a voltage corresponding to a logical "1" will be provided at the output of the SEM No. 1 video signal comparator 68. If the video signal from the first level adjust circuit 60 is below the predetermined voltage, a voltage corresponding to a logical "0" will appear at the output of the SEM No. 1 video signal comparator 68. In a similar manner, the second potentiometer 74 is adjusted so that when a video signal 46′ from the second level adjust circuit 62 is above a predetermined voltage, the voltage corresponding to a logical "1" will be provided at the output of the SEM No. 2 video signal comparator 72, and, when below the predetermined voltage, the voltage corresponding to a logical "0" will appear. Outputs from the two video signal comparators 68 and 72 are provided to the Exclusive-Or gate 76 which in turn provides a "0" output whenever both of its inputs correspond to the same logic state, and a "1" output when its inputs correspond to different logic states. The output of the Exclusive-Or gate controls the electronic switch 78 which is configured so that it is in a first position 83 when the output of the Exclusive-Or gate 76 corresponds to a logical "1", and a second position 84 when it corresponds to a logical "0". When the switch 78 is in the first position 83, the composite video signal 66 is displayed on the TV monitor 80. When the switch 78 is in the second position 84, a gray level corresponding to the setting of the gray level setting potentiometer 82 is displayed. Thus, a viewer looking at the TV monitor 80 sees a representation of the composite video signal 66 during those periods when corresponding segments of the electronic components being scanned have voltage potentials corresponding to opposite logic states, and will see a blanked screen when the segments being scanned have voltage potentials corresponding to the same logic states. As one can appreciate, this embodiment provides a means for rapidly identifying incorrectly functioning digital integrated circuit chips and those areas in which a malfunction is occurring. As previously explained, horizontal and vertical sync pulses are derived from the SEM No. 1 video signal 43′ although they could also be derived from the SEM No. 2 video signal 46′.

Figure 3:
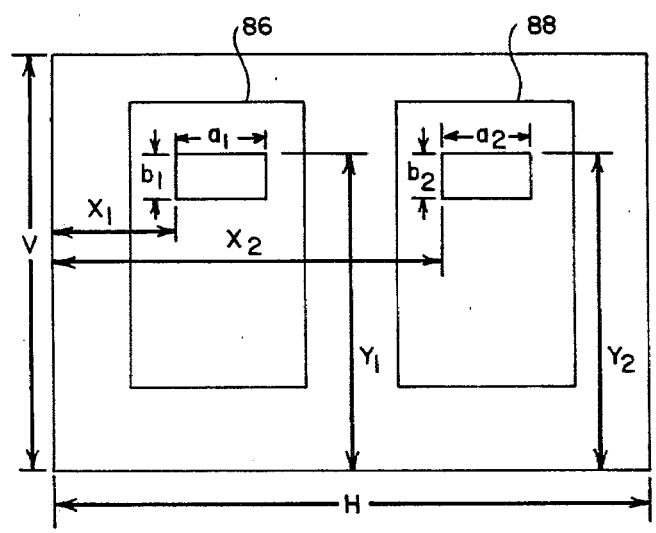
FIG. 3 shows a configuration of two operating electronic components to be compared utilizing a single scanning electron microscope.
Figure 4:
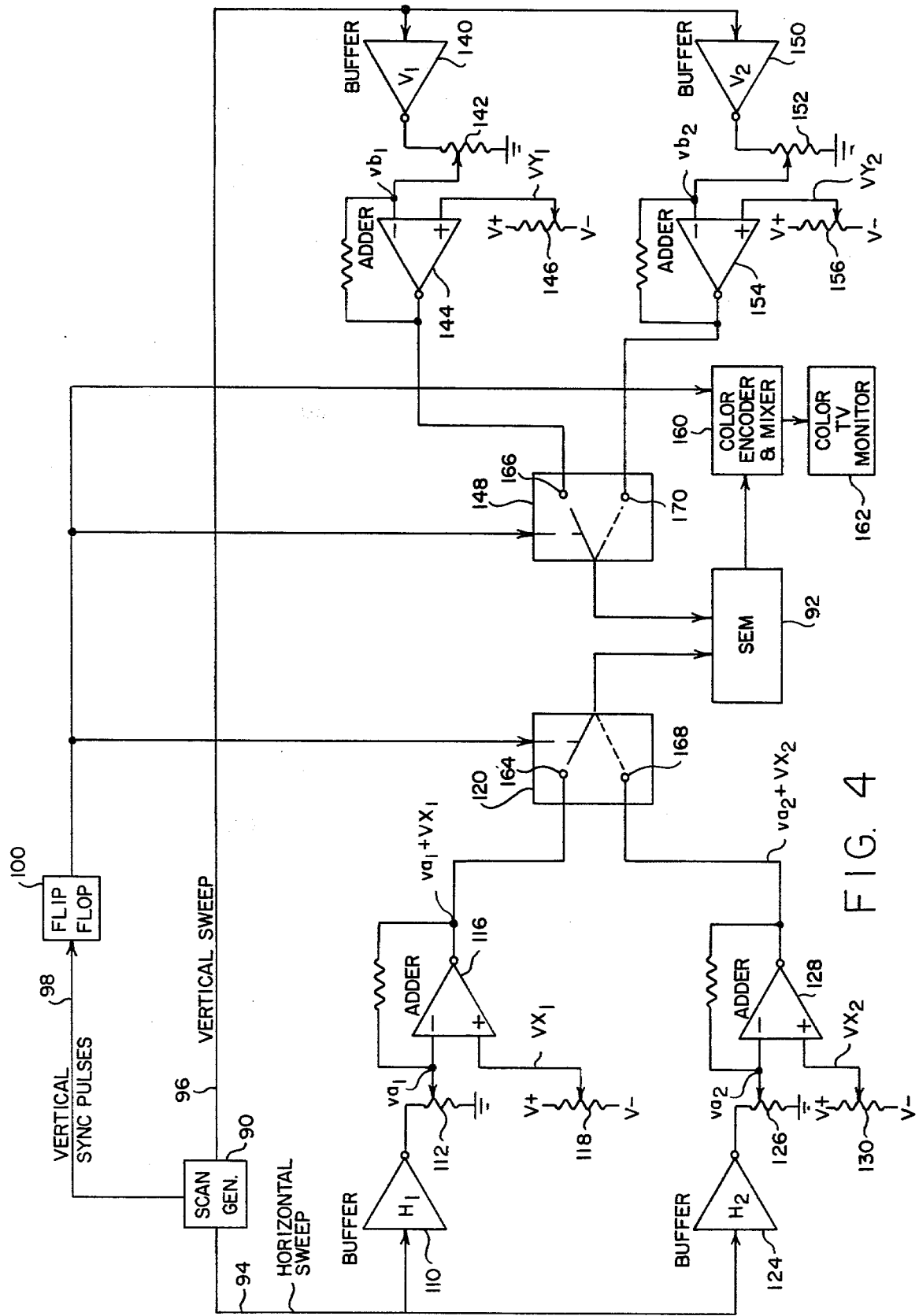
FIG. 4 is a logic diagram showing generation of a scan pattern to be used in scanning the electronic components shown in FIG. 3.

A third embodiment of the invention using a single scanning electron microscope can be understood by reference to FIG. 3 in conjunction with FIG. 4. Referring now to FIG. 3, a side-by-side mounting configuration for two electronic components 86 and 88 to be compared is shown. As in the previous embodiments, the two electronic components are in an operating condition and have the same data inputs. Assume for exemplary purposes that it is desired to compare voltage potentials in an area defined by $a_1b_1$ on the first component 86 with the voltage potentials in an area defined by $a_2b_2$ on the second component 88. Of course, it should be understood that the areas defined by $a_1b_1$ and $a_2b_2$ could equal the total area of the two electronic components 86 and 88. A conventional scan generator 90 shown in FIG. 4 is provided to generate vertical sync pulses and vertical and horizontal sweep signals, these sweep signals causing the scanning electron beam of the SEM to sweep horizontally a distance defined by $a_1$ and $a_2$, and vertically a distance defined by $b_1$ and $b_2$ as will be explained below. A voltage corresponding to position $X_1$ represents an initial condition for the horizontal sweeps required for the area $a_1b_1$ to be examined on the first electronic component 86 and a voltage corresponding to the position $X_2$ represents an initial condition for the horizontal sweeps required for the area $a_2b_2$ to be examined on the second electronic component 88. In a similar manner, a voltage corresponding to the position $Y_1$ defines an initial condition for the first electronic component 86 vertical sweep and a voltage corresponding to the position $Y_2$ defines an initial condition for the second electronic component 88 vertical sweep. This third embodiment provides a means to be explained below for controlling the SEM so that it will scan a predetermined area on the first operating electronic component 86 defined by $a_1b_1$ and beginning at a point defined by $X_1$, $Y_1$, and then scan a predetermined area on the second electronic component 88 defined by $a_2b_2$ and beginning at a point defined by $X_2$, $Y_2$. In the embodiment being described, $a_1=a_2, b_1=b_2$, and $Y_1$-

=$Y_2$, i.e. the two components are assumed to be positioned at the same vertical level.

Referring now to FIG. 4, the scan generator 90 provides horizontal and vertical sweep signals 94 and 96, respectively, and vertical sync pulses 98. The vertical sync pulses 98 are provided to a flip flop 100 whose output changes state at each vertical sync pulse. The horizontal sweep signal 94 provided by the scan generator 90 corresponds to a horizontal distance H shown in FIG. 3 and the vertical sweep signal 96 to a vertical distance V. The horizontal sweep signal 94 is provided to a first horizontal sweep buffer 110, the output of which is connected to a first horizontal sweep potentiometer 112. A voltage is chosen from the first horizontal sweep potentiometer 112 which corresponds to the voltage required for the horizontal sweep to travel a distance corresponding to the distance $a_1$. This voltage is designated at $va_1$ and is provided as one input to a first horizontal sweep adder 116. Another input to the adder 116 is provided by a first horizontal sweep initial position potentiometer 118, the output of which corresponds to the first horizontal sweep initial condition $X_1$, this voltage being designated as $VX_1$. The output of the adder 116 is therefore a voltage corresponding to $VX_1 + va_1$. Thus as can be readily appreciated, $VX_1$ is a bias voltage defining an initial condition for the sweep voltage designated as $va_1$. This voltage is supplied as one input to a horizontal sweep selection switch 120. In a similar manner, the horizontal sweep signal 94 supplied by the scan generator 90 is also provided to a second horizontal sweep buffer 124, the output of which is supplied to a second horizontal sweep potentiometer 126. The potentiometer 126 is set so that the output voltage $va_2$ corresponds to the output voltage $va_1$ in order to insure that both scan patterns define the same horizontal distance. Display of the video signals corresponding to the two electronic components 86 and 88 on the same color TV monitor, which will be explained in detail below, facilitates setting the two horizontal sweep potentiometers 112 and 126 since their outputs with respect to each other can be visually checked. The output voltage $va_2$ from the second horizontal sweep potentiometer 126 is provided to a second horizontal sweep adder 128. The other input to the adder 128 is provided by a second horizontal sweep initial condition potentiometer 130, its output voltage $VX_2$ defining an initial condition for the sweep voltage designated as $va_2$. $VX_2$ and $va_2$ are summed by the adder 128 and provided to the horizontal sweep selection switch 120.

Vertical sweep signals are generated in a manner similar to that used for generation of the horizontal sweep signals. Vertical sweep signals 96 from the scan generator 90 are provided to a first vertical sweep buffer 140, the output of which is supplied to a first vertical sweep potentiometer 142. The output of the potentiometer 142 defines $vb_1$ and corresponds to the vertical sweep distance for the first electronic component 86. This output $vb_1$ is provided as an input to a first vertical sweep adder 144. The initial condition $Y_1$ defining the start of the first vertical sweep is generated by a first vertical sweep initial condition potentiometer 146 whose output voltage is designated as $VY_1$. Both of these voltages $VY_1 + vb_1$ are summed in the first vertical sweep adder 144 and provided to a vertical sweep selection switch 148. Thus, the vertical sweep begins at an initial condition corresponding to the voltage $VY_1$ and then varies in accordance with the voltage $vb_1$. The vertical sweep for the second electronic component 88 is generated in the same manner. The vertical sweep signal 96 is supplied to a second vertical sweep buffer 150 the output of which is supplied to a second vertical sweep potentiometer 152. The output of the second vertical sweep potentiometer 152 corresponds to $vb_2$ and is supplied as one input to a second vertical sweep adder 154. The other input to the adder 154 corresponds to a voltage $VY_2$ representing the initial condition of the vertical sweep for the second electronic component 88 and is supplied by a second vertical sweep initial condition potentiometer 156. The output of the second vertical sweep adder 154 is provided as another input to the vertical sweep selection switch 148. The SEM 92 video output signal is provided to a color encoder and mixer 160, the output of which drives a color TV monitor 162.

In operation, a vertical sync pulse sets the flip-flop 100 which configures the horizontal sweep selection switch 120 and the vertical sweep selection switch 148 in first positions 164 and 166, respectively. With the switches thus configured, the area shown in FIG. 3 as $a_1b_1$ is scanned in accordance with the scanning signals $va_1$ and $vb_1$, the scan being initiated at a point defined by $VX_1$ and $VY_1$. The length of the horizontal sweep $a_1$ is determined by the first horizontal sweep potentiometer 112 as previously explained, and the height of the vertical sweep $b_1$ is determined by the first vertical sweep potentiometer 142. The set condition of the flip-flop 100 which configured the two sweep selection switches 120 and 148 also is used by the color encoder and mixer 160 to encode the video provided by the SEM 92 to correspond to a first predetermined color, which could be one of the primary colors as desribed in the first embodiment. The next vertical sync pulse resets the flip-flop 100, which in turn configures the horizontal and vertical sweep selection switches 120 and 148 to second positions 168 and 170, respectively, as represented by the dotted lines. With the selection switches 120 and 148 thus configured, the horizontal sweep signals at the output of the second horizontal sweep adder 128 and the vertical sweep signals at the output of the second vertical sweep adder 154 define the area shown in FIG. 3 as $a_2b_2$. The horizontal and vertical sweep signals $VX_2 + va_2$ and $VY_2 + vb_2$ are now provided to the SEM 92, thereby causing it to scan the selected portion of the second electronic component 88. The reset signal from the flip-flop 100 also causes the color encoder and mixer 160 to color encode the video output of the SEM 92 to a second predetermined color. This color encoded video then appears on the color TV monitor 162. Thus, the first frame is color-encoded with the first predetermined color corresponding to the area $a_1b_1$ and the second frame is color-encoded with the second predetermined color corresponding to the area $a_2b_2$, the frames being defined by the sweep selection switches 120 and 148 as previously explained. An operator would then adjust the various initial conditions potentiometers 118, 130, 146, and 156 and the sweep potentiometers 112, 126, 142, and 152 until the frames on the color TV monitor are superimposed with respect to each other. This adjustment can be made accurately and quickly by an experienced operator. If the two predetermined colors are red and green, then equal voltages will appear yellow on the color TV monitor 162 and differing voltages will appear either red or green depending upon which component 86 or 88 has the lower voltage at the portion being scanned.

It should now be apparent that a synchronized voltage contrast display analysis system for comparing internal voltage potentials of first and second operating electronic components such as large scale integrated circuits has been described. The apparatus comprises at least one scanning electron microscope which provides output video signals proportional to voltage potentials at various points within each operating electronic component. In one embodiment, these video signals are color encoded and superimposed on a color TV monitor, the resulting color being related to voltage differentials at corresponding points on the electronic components. In another embodiment, the video signals are compared, and differences, when more than a predetermined voltage differential, displayed on a black and white TV monitor.

What is claimed is:

1. An apparatus for comparing internal voltage potentials of first and second electronic components operating simultaneously in response to the same stimuli comprising,
   a first scanning electron microscope having a first output video signal related to voltage potentials within said first electronic component,
   means for generating a predetermined scan pattern,
   first means for scanning said first electronic component in accordance with said predetermined scan pattern,
   a second scanning electron microscope having a second output video signal related to voltage potentials within said second electronic component,
   second means responsive to said first means for simultaneously scanning said second electronic component in accordance with said predetermined scan pattern as said first electronic component is scanned, and
   means responsive to said first and second video signals for displaying a single video signal indicative of a predetermined voltage differential of said predetermined scan pattern.

2. Apparatus as defined in claim 1 wherein said single video signal displayed in color encoded, and said means responsive to said first and second video signals for visually displaying a single video signal includes means for color encoding said single video signal in accordance with differences between said first and second video signals.

3. The apparatus of claim 1 wherein said means for providing comprises
   a television monitor,
   an Exclusive-OR gate having an output of one voltage when corresponding portions of said first and second output video signals differ by less than said predetermined voltage differential and an output of another voltage when corresponding portions of said first and second output video signals differ by more than said predetermined voltage differential,
   means for providing a first signal corresponding to said first visually-identifiable indication to said television monitor when said Exclusive-OR gate has an output of said one voltage, and
   means for providing a second signal corresponding to a second visually-identifiable indication to said television monitor when said Exclusive-OR gate has an output of said another voltage.

4. The apparatus of claim 3 wherein said first signal is a composite signal related to said first and second output video signals and said second signal is a constant voltage corresponding to a predetermined grey-level display on said television monitor.

5. Apparatus for comparing operation of a first electronic component with a second electronic component in response to the same electrical stimuli, comprising
   means for simultaneously applying said input electrical stimuli to said first and second operating electronic components,
   scanning electron microscope means for detecting internal voltage patterns of said components and producing first and second video signals at successive points scanned with an intensity proportional to the voltages at said points of respective first and second components, said video signals being produced in response to secondary electron signals generated as a result of a primary electron signals generated as a result of a primary electron beam intersecting each of said operating electronic components in accordance with a predetermined scan pattern synchronously applied to each,
   means for generating a scan control signal for said scanning electron microscope means to produce said predetermined scan pattern of electron beams, and
   means responsive to said first and second video signals for visually displaying a single video signal indicative of any difference between said first and second video signals.

6. Apparatus as defined in claim 5 wherein said scanning electron microscope means is comprised of first and second scanning electron microscopes, each controlled to scan in synchronism in response to said scan control signal.

7. Apparatus as defined in claim 5 wherein said scanning electron microscope means is comprised of a single electron microscope.

8. Apparatus as defined in claim 5, 6 or 7 wherein said single video signal displayed is color encoded, and said means responsive to said first and second video signals for visually displaying a single video signal includes means for color encoding said single video signal in accordance with differences between said first and second video signals.

9. Apparatus as defined in claim 5 or 6 wherein said single video signal displayed is intensity coded, and said means responsive to said first and second video signals for visually displaying a single video signal includes means for intensity encoding said single video signal in accordance with differences between said first and second video signals.

10. An apparatus for comparing internal voltage potentials of first and second electronic components operating simultaneously in response to the same stimuli, comprising
   a scanning electron microscope means,
   means for generating a master scanning pattern,
   first means for causing said scanning electron microscope means to scan said first operating electronic component by a primary electron beam in accordance with a first predetermined scanning pattern related to said master scanning pattern, thereby creating a first secondary electron signal related to a voltage potential at the intersection of said primary electron beam and said first operating electronic component,
   second means for causing said scanning electron microscope means to scan said second operating electronic component by a primary electron beam in accordance with a second predetermined scanning pattern related to said master scanning pattern, thereby creating a second secondary electron signal related to a voltage potential at the intersection of said primary electron beam and said second operating electronic component, means for generating first and second video signals related to said first and second secondary electron signals respectively, and display means responsive to said first and second video signals for displaying a single signal representative of voltage differences between predetermined portions of said first and second video signals.

11. The apparatus of claim 10 wherein said scanning electron microscope means comprises first and second scanning electron microscopes, said first means comprises means for controlling said first scanning electron microscope, and said second means comprises means for controlling said second scanning electron microscope.

12. The apparatus of claim 11 wherein said single video signal displayed is color encoded, and said means responsive to said first and second video signals for visually displaying a single video signal includes means for color encoding said single video signal in accordance with differences between said first and second video signals.

13. The apparatus of claim 11 wherein said display means comprises
a color kinescope having a first color gun and a second color gun,
means for driving said first color gun by said first video signal, and
means for driving said second color gun by said second video signal whereby substantially identical voltage levels of said first and second video signals will provide one color on said kinescope display and unequal voltage levels of said first and second video signals will provide other colors on said kinescope display.

14. The apparatus of claim 13 wherein said first color gun is a red gun and said second color gun is a green gun.

15. The apparatus of claim 11 wherein said display means comprises
a color television monitor,
means for color encoding said first and second video signals to correspond to first and second colors, respectively, thereby providing a color-encoded video display signal, and
means for driving said color television monitor with said color-encoded video display signal whereby substantially identical voltage levels of said first and second video signals will provide one color on said color television monitor and unequal voltage levels of said first and second video signals will provide other colors on said color television monitor.

16. The apparatus of claim 10 wherein said scanning electron microscope is comprised of a single scanning electron microscope and multiplexing means for alternately switching a single primary electron beam to said first and second components at a high rate for synchronously scanning both components in accordance with said predetermined scan pattern and obtaining said first and second video signals for voltage comparison of corresponding points scanned.

17. The apparatus of claim 16 wherein said display means is comprised of
a color kinescope having a first color gun and a second color gun, and
switch means for alternately connecting said first video signal corresponding to said first predetermined scanning pattern to said first color gun and said second video signal corresponding to said second predetermined scanning pattern to said second color gun whereby patterns on said color kinescope display created by first and second color guns will appear superimposed.

18. An apparatus for comparing internal voltage potentials of first and second electronic components operating simultaneously in response to the same stimuli, comprising
a first scanning electron microscope having an output video signal related to voltage potentials within said first electronic component,
first means for causing said first scanning electron microscope to scan said first electronic component in accordance with a predetermined scan pattern,
a second scanning electron microscope having an output video signal related to voltage potentials within said second electronic component,
second means responsive to said first means for causing said second scanning electron microscope to simultaneously scan said second electronic component in accordance with said predetermined scan pattern as said first electronic component is scanned,
means for color encoding said first scanning electron microscope output video signal to correspond to a first color,
means for color encoding said second scanning electron microscope output video signal to correspond to a second color,
a color television monitor, and
means for driving said color television monitor by said color encoded first and second output video signals whereby voltage differences at corresponding points on said first and second operating electronic components can be visually identified.

19. The apparatus of claim 18 wherein said first scanning electron microscope video signal is color encoded to correspond to red and said second scanning electron microscope output video signal is color encoded to correspond to green.

20. An apparatus for comparing internal voltage potentials of first and second electronic components operating simultaneously in response to the same stimuli comprising
a scanning electron microscope having an output video signal related to voltage potentials within said first and second operating electronic components,
means for generating a master scanning pattern,
means for controlling said scanning electron microscope to alternately scan areas of said first electronic component in accordance with a first predetermined scan pattern related to said master scanning pattern, and areas of said second electronic component in accordance with a second predetermined scan pattern related to said master scanning pattern, corresponding areas of said first and second components being scanned in successive order,
means for identifying portions of said output video signal corresponding to areas of said first predetermined scan pattern and portions of said output video signal corresponding to areas of said second predetermined scan pattern, and means for displaying differences between said identified portions of said output video signal related to corresponding areas of said first and second predetermined scan patterns.

21. The apparatus of claim 20 wherein said means for displaying comprises, a color television monitor, means for generating a first color-encoded video signal corresponding to said output video signal portion corresponding to said first predetermined scan pattern;

means for generating a second color-encoded video signal corresponding to said output video signal portion corresponding to said second predetermined scan pattern, and means for alternately providing said first color-encoded video signal and said second color-encoded video signal to said color television monitor.

22. A method for comparing internal voltage potentials of first and second operating electronic components, comprising the steps of generating a master scanning pattern, causing a scanning electron microscope means to scan said first operating electronic component by a primary electron beam in accordance with a first predetermined scanning pattern related to said master scanning pattern, thereby creating a first secondary electron signal related to a voltage potential at the intersection of said primary electron beam and said first operating electronic component, causing said scanning electron microscope means to scan said second operating electronic component by a primary electron beam in accordance with a second predetermined scanning pattern related to said master scanning pattern, thereby creating a second secondary electron signal related to a voltage potential at the intersection of said primary electron beam and said second operating electronic component, generating first and second video signals related to said first and second secondary electron signals, respectively, and visually identifying voltage differences between predetermined portions of said first and second video signals.

* * * * *